US012765182B2

(12) United States Patent
Yu et al.

(10) Patent No.: US 12,765,182 B2
(45) Date of Patent: Oct. 13, 2026

(54) DISPLAY SUBSTRATE, DISPLAY DEVICE, AND FINE METAL MASK

(71) Applicants: Chengdu BOE Optoelectronics Technology Co., Ltd., Chengdu (CN); BOE Technology Group Co., Ltd., Beijing (CN)

(72) Inventors: Zhaowei Yu, Beijing (CN); Rongjian Yan, Beijing (CN); Jeonghaeng Heo, Beijing (CN); Sangcheon Youn, Beijing (CN); Yingchang Gao, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 434 days.

(21) Appl. No.: 18/556,277

(22) PCT Filed: Oct. 22, 2021

(86) PCT No.: PCT/CN2021/125520
§ 371 (c)(1),
(2) Date: Oct. 19, 2023

(87) PCT Pub. No.: WO2022/222397
PCT Pub. Date: Oct. 27, 2022

(65) Prior Publication Data

US 2024/0215331 A1 Jun. 27, 2024

(30) Foreign Application Priority Data

Apr. 20, 2021 (CN) ......................... 202110425753.7

(51) Int. Cl.
*H10K 59/122* (2023.01)
*H10K 59/35* (2023.01)

(52) U.S. Cl.
CPC ......... *H10K 59/122* (2023.02); *H10K 59/352* (2023.02); *H10K 59/353* (2023.02)

(58) Field of Classification Search
CPC ... H10K 59/122; H10K 59/352; H10K 59/353
(Continued)

(56) References Cited

U.S. PATENT DOCUMENTS

2007/0210706 A1* 9/2007 Song .................. H10K 59/8723 313/506
2007/0252518 A1* 11/2007 Lee ...................... H10K 71/135 313/504

(Continued)

FOREIGN PATENT DOCUMENTS

CN 1882207 A 12/2006
CN 101034715 A 9/2007

(Continued)

OTHER PUBLICATIONS

PCT/CN2021/125520 international search report.
CN202110425753.7 first office action dated Dec. 3, 2024.

*Primary Examiner* — Christopher M Raabe
(74) *Attorney, Agent, or Firm* — IPro, PLLC

(57) ABSTRACT

A display substrate, a display device, and a fine metal mask provided by the present disclosure, the display substrate including a base substrate; a plurality of mutually independent first electrodes, which are located on the base substrate; a pixel definition layer, which is located on the side of a layer in which the plurality of first electrodes are located away from the base substrate; a light-emitting material layer, which is located on the side of the pixel definition layer away from the base substrate; and a support layer, which is located above the pixel definition layer and is in direct contact with the light-emitting parts.

7 Claims, 12 Drawing Sheets

(58) Field of Classification Search
USPC .................................................. 313/498–512
See application file for complete search history.

(56) References Cited

U.S. PATENT DOCUMENTS

| | | | | |
|---|---|---|---|---|
| 2017/0250236 | A1* | 8/2017 | Xiong | H10K 59/122 |
| 2018/0190731 | A1* | 7/2018 | Park | H10K 59/8723 |
| 2018/0294322 | A1* | 10/2018 | Han | H10K 59/126 |
| 2019/0013370 | A1* | 1/2019 | Nie | H10K 59/8723 |
| 2019/0067390 | A1* | 2/2019 | Gao | H10K 59/80522 |
| 2022/0006052 | A1 | 1/2022 | Huang | |
| 2023/0014543 | A1* | 1/2023 | Fan | H10K 59/122 |

FOREIGN PATENT DOCUMENTS

| | | | |
|---|---|---|---|
| CN | 107346778 | A | 11/2017 |
| CN | 107565048 | A | 1/2018 |
| CN | 110085769 | A | 8/2019 |
| CN | 112349760 | A | 2/2021 |
| CN | 113013222 | A | 6/2021 |
| CN | 215527731 | U | 1/2022 |
| JP | 2010140852 | A | 6/2010 |
| KR | 20190082183 | A | 7/2019 |
| WO | 2018188162 | A1 | 10/2018 |

* cited by examiner

DISPLAY SUBSTRATE, DISPLAY DEVICE, AND FINE METAL MASK

CROSS REFERENCE TO RELATED APPLICATION

The present disclosure is a National Stage of International Application No. PCT/CN2021/125520, filed on Oct. 22, 2021, which claims the priority of Chinese patent application No. 202110425753.7, filed with the Chinese Patent Office on Apr. 20, 2021 and named "Display Substrate, Display Device, and Fine Metal Mask", the entire contents of which are incorporated herein by reference.

TECHNICAL FIELD

The present disclosure relates to the field of display technology, and in particular to a display substrate, a display device and a fine metal mask.

BACKGROUND

An organic electroluminescence (organic light-emitting diode, OLED) display device is a display screen based on organic electroluminescence diodes. It has excellent properties such as self-illumination, high contrast, high resolution, small thickness, wide viewing angle, fast response speed, color saturation, low energy consumption, applicable in flexible panels, wide operating temperature range, simple structure and process, etc., and is known as a dream display, which has received more and more attention and has broad application prospects.

SUMMARY

The embodiments of present disclosure provide a display substrate, a display device and a fine metal mask. The specific solutions are as follows.

In one aspect, the embodiments of present disclosure provide a display substrate, including:

- a base substrate;
- a plurality of mutually independent first electrodes on the base substrate;
- a pixel definition layer on a side away from the base substrate, of a layer where the plurality of first electrodes are; where the pixel definition layer includes a plurality of pixel openings, an overlapping portion and a non-overlapping portion are provided between the pixel opening and the first electrode, the non-overlapping portion surrounds the overlapping portion, and the pixel definition layer covers the non-overlapping portion and a gap between the first electrodes;
- a light-emitting material layer on a side away from the base substrate, of the pixel definition layer; where the light-emitting material layer includes a plurality of light-emitting parts, and the light-emitting parts extend from the pixel openings to the pixel definition layer; and
- a support layer on the pixel definition layer and being in direct contact with the light-emitting parts; where an orthographic projection of the support layer on the base substrate overlaps orthographic projections of gaps among the plurality of first electrodes on the base substrate.

Optionally, in the above display substrate provided by the embodiments of the present disclosure, the support layer is only in contact with the light-emitting parts at lateral surfaces.

Optionally, in the above display substrate provided by the embodiments of the present disclosure, the plurality of light-emitting parts include a plurality of red light-emitting parts, a plurality of green light-emitting parts and a plurality of blue light-emitting parts;

- one red light-emitting part, two green light-emitting parts and one blue light-emitting part form a pixel unit, and pixel units are arranged cyclically in both a row direction and a column direction;
- in the pixel unit, the red light-emitting part and the blue light-emitting part are alternately arranged in the column direction, the two green light-emitting parts are alternately arranged in the column direction, and the two green light-emitting parts are at the same side of the red light-emitting part and the blue light-emitting part;
- a first gap is provided between the two green light-emitting parts of the same pixel unit, and the first gap is adjacent to the blue light-emitting part; and
- a second gap is provided between adjacent green light-emitting parts of adjacent pixel units, and the second gap is adjacent to the red light-emitting part.

Optionally, in the above display substrate provided by the embodiments of the present disclosure, the support layer is at the first gap.

Optionally, in the above display substrate provided by the embodiments of the present disclosure, the red light-emitting part, the green light-emitting part and the blue light-emitting part are all rectangular in shape; long sides of the red light-emitting part, the green light-emitting part and the blue light-emitting part extend in the column direction; and short sides of the red light-emitting part, the green light-emitting part and the blue light-emitting part extend in the row direction.

Optionally, in the above display substrate provided by the embodiments of the present disclosure, a shape of the green light-emitting part is a right-angled trapezoid, and shapes of the blue light-emitting part and the red light-emitting part are both rectangles;

- two bottom sides of the green light-emitting part extend along the column direction, a right-angled waist of the green light-emitting part is adjacent to the second gap, and other waist of the green light-emitting part is adjacent to the first gap; and long sides of the red light-emitting part and the blue light-emitting part extend in the column direction, and short sides of the red light-emitting part and the blue light-emitting part extend in the row direction.

Optionally, in the above display substrate provided by the embodiments of the present disclosure, the plurality of light-emitting parts include a plurality of red light-emitting parts, a plurality of green light-emitting parts and a plurality of blue light-emitting parts;

- one red light-emitting part, two green light-emitting parts and one blue light-emitting part form a pixel unit, and pixel units are arranged cyclically in both a first direction and a second direction; the first direction intersects with the row direction and the column direction; and the second direction intersects with the first direction, the row direction, and the column direction;
- in the pixel unit, the red light-emitting part and the green light-emitting part are alternately arranged in the first direction and the second direction, and the blue light-emitting part and the green light-emitting part are alternately arranged in the first direction and the second direction;

in the first direction, a third gap is provided between the red light-emitting part and the green light-emitting part, and a fourth gap is provided between the blue light-emitting part and the green light-emitting part; and in the second direction, a fifth gap is provided between the red light-emitting part and the green light-emitting part, and a sixth gap is provided between the blue light-emitting part and the green light-emitting part.

Optionally, in the above display substrate provided by the embodiments of the present disclosure, the support layer is at the third gap, and one third gap is provided between adjacent support layers in the first direction.

Optionally, in the above display substrate provided by the embodiments of the present disclosure, the red light-emitting part, the green light-emitting part and the blue light-emitting part are all rhombic in shape; and two sets of opposite sides of the red light-emitting part, the green light-emitting part and the blue light-emitting part extend respectively along the first direction and the second direction; and a shape of the support layer is a rhombus, and two sets of opposite sides of the support layer extend along the first direction and the second direction respectively.

Optionally, in the above display substrate provided by the embodiments of the present disclosure, the plurality of light-emitting parts include a plurality of red light-emitting parts, a plurality of green light-emitting parts and a plurality of blue light-emitting parts;

one red light-emitting part, one green light-emitting part and one blue light-emitting part form a pixel unit, and pixel units are arranged cyclically in both the row direction and the column direction;

in the pixel unit, the red light-emitting part and the green light-emitting part are alternately arranged in the column direction, and the red light-emitting part and the green light-emitting part are at the same side of the blue light-emitting part;

multiple rows of support layers are provided; an i-th row of support layer is at a gap between adjacent pixel units, and an (i+1)-th row of support layer is at a gap between a column where the blue light-emitting part is and a column where the red light-emitting part is, in the pixel unit; and the i-th row of support layer and the (i+1)-th row of support layer do not overlap with each other in the column direction, and i is an odd number.

Optionally, in the above display substrate provided by the embodiments of the present disclosure, opposite sides of the red light-emitting part and the green light-emitting part are straight lines and parallel to each other, and a shape of the blue light-emitting part is a rounded rectangle.

Optionally, in the above display substrate provided by the embodiments of the present disclosure, shapes of the red light-emitting part, the green light-emitting part and the blue light-emitting part are rounded rectangles.

Optionally, in the above display substrate provided by the embodiments of the present disclosure, shapes of the red light-emitting part, the green light-emitting part and the blue light-emitting part are quadrilaterals, where two sets of diagonal corners of the blue light-emitting part are respectively right angles and arc chamfers; one of four corners of the red light-emitting part is an arc chamfer and three of the four corners of the red light-emitting part are right angles; one of four corners of the green light-emitting part is an arc chamfer and three of the four corners of the green light-emitting part are right angles; and a gap between adjacent pixel units are surrounded by arc chamfers or right angles.

Optionally, in the above display substrate provided by the embodiments of the present disclosure, a shape of an orthographic projection of the pixel opening covered by the light-emitting part on the base substrate is same as a shape of an orthographic projection of the light-emitting part on the base substrate.

Optionally, in the above display substrate provided by the embodiments of the present disclosure, a lateral surface of the support layer is in contact with a lateral surface of the light-emitting part; and a surface edge on a side away from the base substrate, of the support layer is in contact with a surface edge on a side facing the base substrate, of the light-emitting part.

Optionally, in the above display substrate provided by the embodiments of the present disclosure, the plurality of light-emitting parts include a plurality of red light-emitting parts, a plurality of green light-emitting parts and a plurality of blue light-emitting parts;

one red light-emitting part, two green light-emitting parts and one blue light-emitting part form a pixel unit, and pixel units are arranged cyclically in both the row direction and the column direction;

in the pixel unit, the red light-emitting part and the blue light-emitting are alternately arranged in the column direction, the two green light-emitting parts are alternately arranged in the column direction, and the two green light-emitting parts are at the same side of the red light-emitting part and the blue light-emitting part; and an orthographic projection of the support layer on the base substrate overlaps with an orthographic projection of an edge adjacent to the green light-emitting part, of the blue light-emitting part on the base substrate, and an orthographic projection of an edge adjacent to the blue light-emitting part, of the green light-emitting part on the base substrate.

Optionally, in the above display substrate provided by the embodiments of the present disclosure, the plurality of light-emitting parts include a plurality of red light-emitting parts, a plurality of green light-emitting parts and a plurality of blue light-emitting parts;

one red light-emitting part, one green light-emitting part and one blue light-emitting part form a pixel unit, and pixel units are arranged cyclically in both the row direction and the column direction;

the red light-emitting part and the green light-emitting part in the pixel unit are alternately arranged in the column direction; and the red light-emitting part and the green light-emitting part are at the same side of the blue light-emitting part; and an orthographic projection of the support layer on the base substrate overlaps with an orthographic projection of an edge adjacent to the green light-emitting part, of the red light-emitting part on the base substrate, and an orthographic projection of an edge adjacent to the red light-emitting part, of the green light-emitting part in the pixel unit on the base substrate.

Optionally, in the above display substrate provided by the embodiments of the present disclosure, in the pixel unit, a pixel opening covered by the red light-emitting part includes a first side, and a pixel opening covered by the green light-emitting part includes a second side, the first side and the second side are both adjacent to the support layer;

the first side includes a first avoidance part, the second side includes a second avoidance part, and both the first avoidance part and the second avoidance part are recessed in a direction away from the support layer; and a shape of the first avoidance part is the same as a shape of a side adjacent to the first avoidance part, of the support layer, and a shape of the second avoidance part is the same as a shape of a side adjacent to the second avoidance part, of the support layer.

Optionally, in the above display substrate provided by the embodiments of the present disclosure, the plurality of light-emitting parts include a plurality of red light-emitting parts, a plurality of green light-emitting parts and a plurality of blue light-emitting parts;

one red light-emitting part, one green light-emitting part and one blue light-emitting part form a pixel unit, and pixel units are arranged cyclically in both the row direction and the column direction; and in the pixel unit, the red light-emitting part and the green light-emitting part are alternately arranged in the column direction, and the red light-emitting part and the green light-emitting part are at the same side of the blue light-emitting part; and an orthographic projection of the support layer on the base substrate overlaps with orthographic projections of adjacent edges of the red light-emitting part, the green light-emitting part, and the blue light-emitting part in the pixel unit on the base substrate.

Optionally, in the above display substrate provided by the embodiments of the present disclosure, in the pixel unit, a pixel opening covered by the red light-emitting part includes a first corner area, and a pixel opening covered by the green light-emitting part includes a second corner area, a pixel opening covered by the blue light-emitting part includes a third side, and the first corner area, the second corner area and the third side are all adjacent to the support layer;

the first corner area includes a third avoidance part, the second corner area includes a fourth avoidance part, the third side includes a fifth avoidance part, the third avoidance part, the fourth avoidance part and the fifth avoidance part are all recessed in a direction away from the support layer; and the third avoidance part has a same shape as the support layer adjacent to the third avoidance part; the fourth avoidance part has a same shape as the support layer adjacent to the fourth avoidance part; and the fifth avoidance part has a same shape as the support layer adjacent to the fifth avoidance part.

Optionally, in the above display substrate provided by the embodiments of the present disclosure, the display substrate further including: a second electrode; where the second electrode is disposed on a side away from the pixel definition layer, of the light-emitting material layer on a whole surface.

In another aspect, the embodiments of the present disclosure further provide a display device, including the aforementioned display substrate.

In another aspect, the embodiments of the present disclosure further provide a fine metal mask, for producing the aforementioned light-emitting material layer, where the fine metal mask includes: a plurality of opening areas, and the plurality of opening areas correspond to the plurality of light-emitting parts in shape and location.

DETAILED DESCRIPTION

Figure 1:
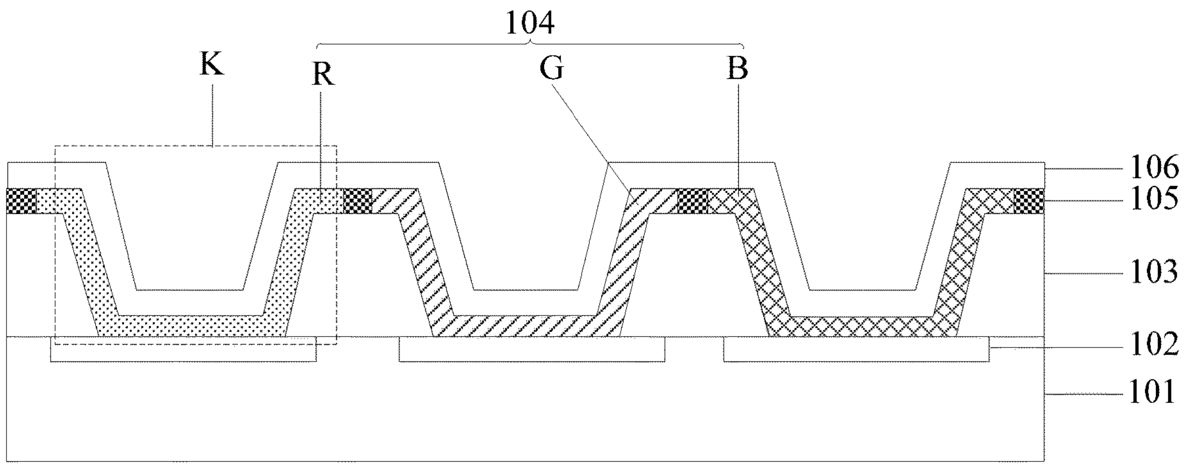
FIG. 1 is a schematic structural diagram of a display substrate provided by an embodiment of the present disclosure.

In order to make the purpose, technical solutions and advantages of the embodiments of the present disclosure more clear, the technical solutions of the embodiments of the present disclosure will be clearly and completely described below in conjunction with the drawings of the embodiments of the present disclosure. It should be noted that the sizes and shapes of the figures in the drawings do not reflect true proportions and are only intended to illustrate the present disclosure, and the same or similar reference numbers throughout represent the same or similar elements or elements with the same or similar functions. Obviously, the described embodiments are some, but not all, of the embodiments of the present disclosure. Based on the described embodiments of the present disclosure, all other embodiments obtained by those of ordinary skill in the art without creative efforts fall within the scope of protection of the present disclosure.

Unless otherwise defined, technical or scientific terms used herein shall have their ordinary meaning understood by a person of ordinary skill in the art to which this disclosure belongs. "First", "Second" and similar words used in this disclosure and the claims do not indicate any order, quantity or importance, but are only used to distinguish different components. Words such as "include" or "comprise" mean that the elements or things appearing before the word include the elements or things listed after the word and their equivalents, without excluding other elements or things. "Inside", "outside", "up", "down", etc., are only used to express relative positional relationships. When the absolute position of the described object changes, the relative positional relationship may also change accordingly.

In the related art, the mainstream manufacturing process of OLED display devices is the evaporation process. In the evaporation process, the light-emitting material generated by the evaporation source is deposited into the sub-pixel area of the display substrate through the opening area of a fine metal mask (FMM). However, with the requirement of high resolution (pixels per inch, PPI), the size of the sub-pixel area is getting smaller and smaller, which easily causes poor color mixing when evaporating to form a pixel array.

In order to at least solve the above technical problems existing in the related art, embodiments of the present disclosure provide a display substrate, as shown in FIG. 1, which may include:

a base substrate 101;

a plurality of mutually independent first electrodes 102 located on the base substrate 101;

a pixel definition layer 103 located on a side away from the base substrate 101, of a layer where the plurality of first electrodes 102 are located; where the pixel definition layer 103 includes a plurality of pixel openings K, an overlapping portion and a non-overlapping portion are provided between the pixel opening K and the first electrode 102, the non-overlapping portion surrounds the overlapping portion, and the pixel definition layer 103 covers the non-overlapping portion and the gap between the first electrodes 102;

a light-emitting material layer 104 located on a side away from the base substrate 101, of the pixel definition layer 103; where the light-emitting material layer 104 includes a plurality of light-emitting parts (for example, a red light-emitting part R, a green light-emitting part G, a blue light-emitting part B); and the light-emitting parts (for example, the red light-emitting part R, the green light-emitting part G, and the blue light-emitting part B) extend from the pixel openings K to the pixel definition layer 103; and a support layer 105 located on the pixel definition layer 103; where the support layer 105 is in direct contact with the light-emitting parts (for example, the red light-emitting part R, the green light-emitting part G, and the blue light-emitting part B); and an orthographic projection of the support layer 105 on the base substrate 101 overlaps orthographic projections of the gaps among the plurality of first electrodes 102 on the base substrate 101. FIG. 1 shows that the orthographic projection of the support layer 105 on the base substrate 101 is within the orthographic projections of the gaps among the plurality of first electrodes 102 on the base substrate 101.

In the above-mentioned display substrate provided by embodiments of the present disclosure, the support layer 105 can effectively separate adjacent light-emitting parts (such as the red light-emitting part R, the green light-emitting part G, and the blue light-emitting part B) by disposing the support layer 105 in contact with the light-emitting parts (such as the red light-emitting part R, the green light-emitting part G, and the blue light-emitting part B) above the gaps among the plurality of first electrodes 102, thereby reducing the risk of color mixing and improving display quality.

Optionally, in the above-mentioned display substrate provided by embodiments of the present disclosure, as shown in FIGS. 1 to 7, the support layer 105 and the light-emitting parts (such as the red light-emitting part R, the green light-emitting part G, and the blue light-emitting part B) can be only in contact at side surfaces, and there is no pattern of light-emitting parts (such as red light-emitting parts R, green light-emitting parts G, and blue light-emitting parts B) above the support layer 105. That is, the support layer 105 and the light-emitting parts are in contact with each other but not overlap each other. Therefore, the support layer 105 can effectively separate the light-emitting parts (such as the red light-emitting part R, the green light-emitting part G, and the blue light-emitting part B) to improve poor color mixing.

In addition, the support layer 105 is in an area outside the light-emitting parts (i.e., the non-opening area of the FMM), which solves the problem of excessively high film layers on the supporting layer 105 caused by the accumulation of light-emitting materials on the supporting layer 105 when the supporting layer 105 is partially located in the opening area of the FMM. This prevents the movement of the fine metal mask in the evaporation chamber from scratching the film layer at the support layer 105 and avoids the problem of flying light-emitting materials and product reliability failure caused by scratches. At the same time, it can improve the evaporation chamber environment and improve product quality.

Figure 2:
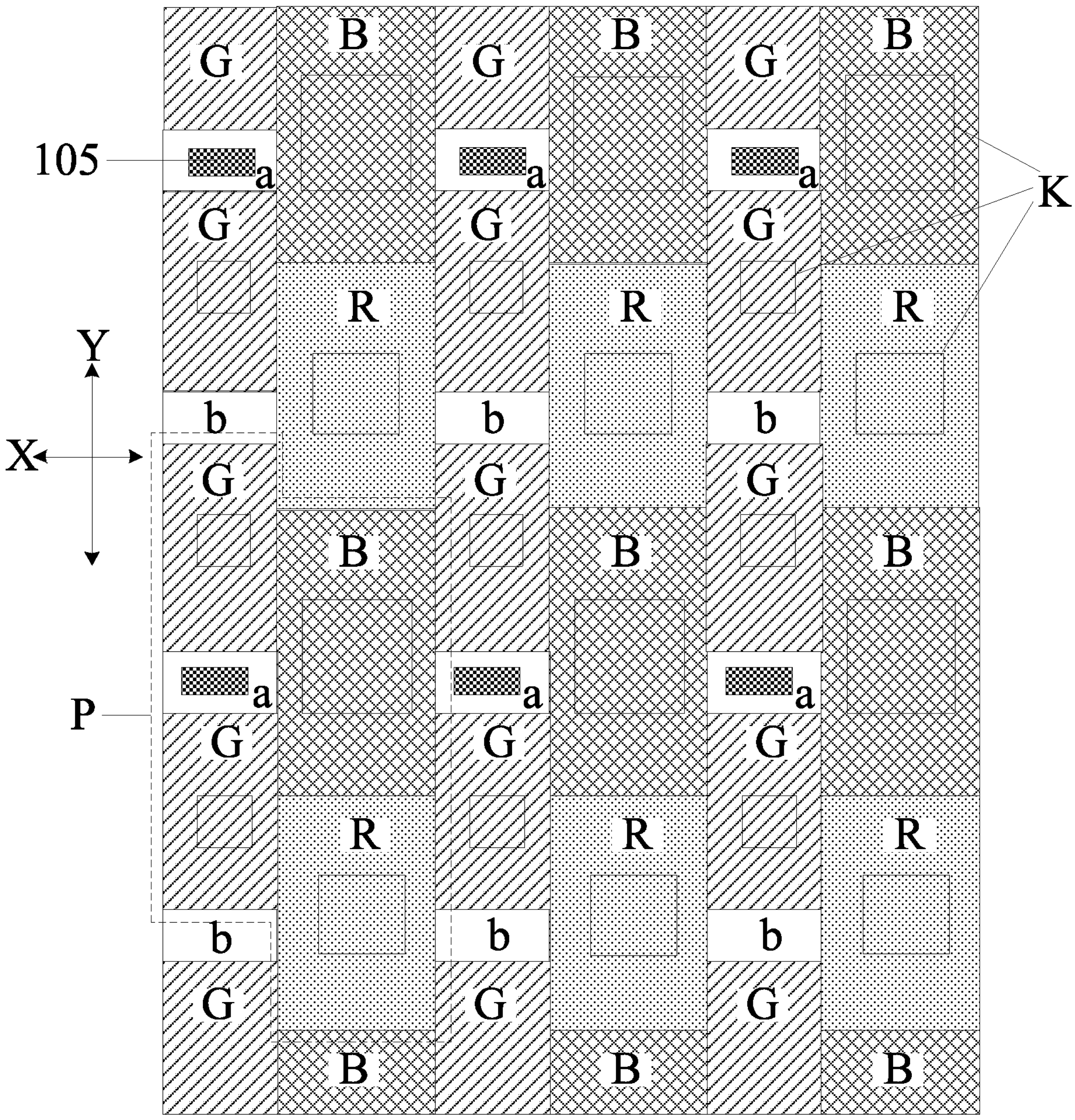
FIG. 2 is a schematic diagram of a pixel arrangement provided by an embodiment of the present disclosure.
Figure 3:
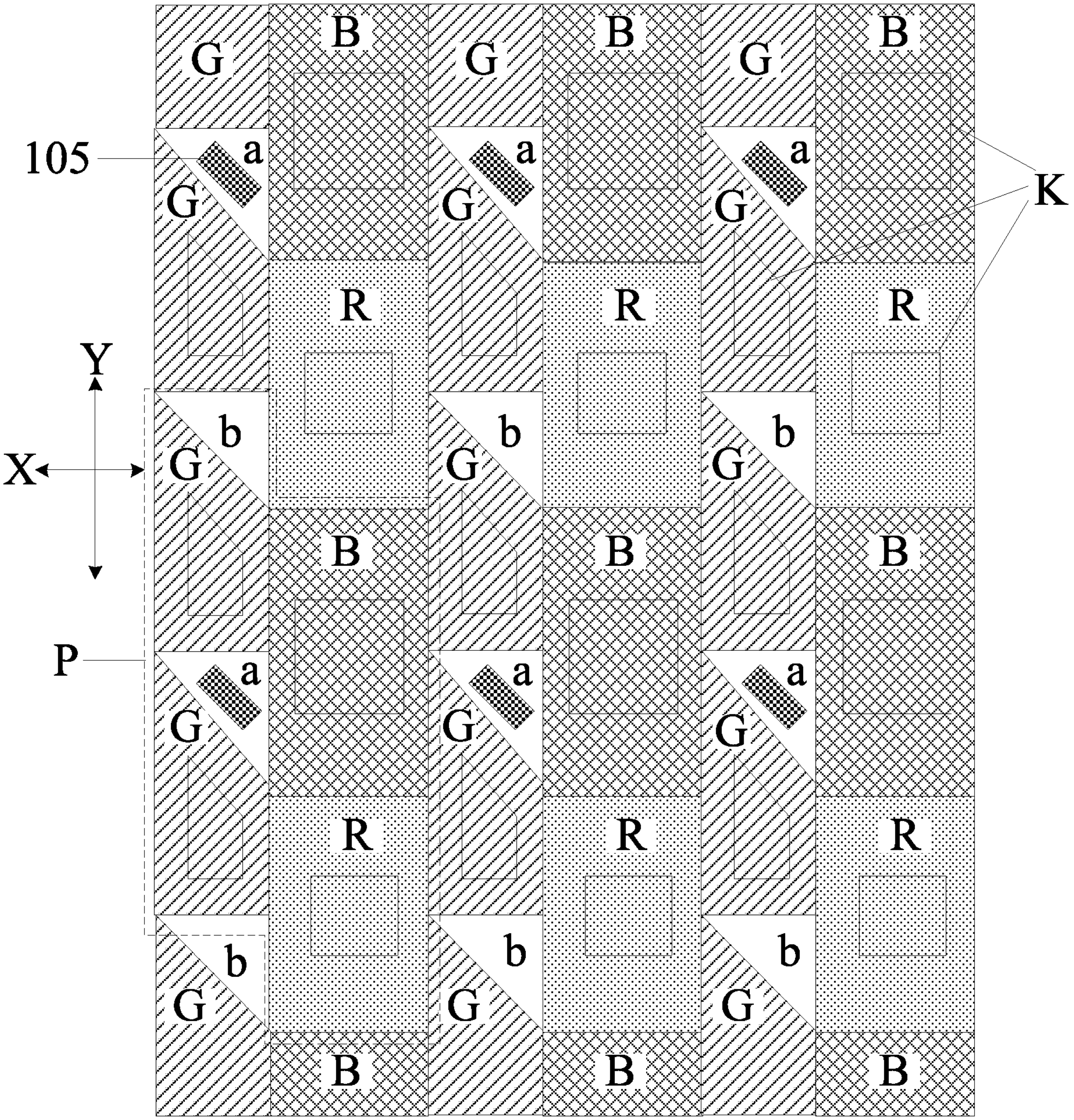
FIG. 3 is another schematic diagram of a pixel arrangement provided by an embodiment of the present disclosure.

Optionally, in the above display substrate provided by embodiments of the present disclosure, as shown in FIGS. 2 and 3, the plurality of light-emitting parts may include a plurality of red light-emitting parts R, a plurality of green light-emitting parts G and a plurality of blue light-emitting parts B;

one red light-emitting part R, two green light-emitting parts G and one blue light-emitting part B form a pixel unit P, and the pixel units P are arranged cyclically in both a row direction X and a column direction Y;

in the pixel unit P, the red light-emitting part R and the blue light-emitting part B are alternately arranged in the column direction Y, two green light-emitting parts G are alternately arranged in the column direction Y, and the two green light-emitting parts G are at the same side of the red light-emitting part R and the blue light-emitting part B;

a first gap a is provided between the two green light-emitting parts G of the same pixel unit P, and the first gap a is adjacent to the blue light-emitting part B; and a second gap b is provided between adjacent green light-emitting parts G of adjacent pixel units P, and the second gap b is adjacent to the red light-emitting part R.

In some embodiments, as shown in FIG. 2, the support layer 105 may be at the first gap a. Of course, during specific implementation, the arrangement density and position of the support layer 105 can also be flexibly set. For example, the support layer 105 can be disposed at the second gap b, or the support layer 105 can be disposed at both the first gap a and the second gap b, which is not limited here.

In some embodiments, as shown in FIG. 2, the shapes of the red light-emitting part R, the green light-emitting part G and the blue light-emitting part B are all rectangles, and long sides of the red light-emitting part R, the green light-emitting part G and the blue light-emitting part B extend along the column direction Y, and short sides of the red light-emitting part R, the green light-emitting part G and the blue light-emitting part B extend along the row direction X. The shape of the support layer 105 is a rectangle, and a long side of the support layer 105 extends along the row direction X, and a short side of the support layer 105 extends along the column direction Y. Of course, the shape of the support layer 105 can also be a shape known to those skilled in the art, such as a ladder, and is not specifically limited here.

In some embodiments, as shown in FIG. 3, the shape of the green light-emitting part G is a right-angled trapezoid, and the shapes of the blue light-emitting part B and the red light-emitting part R are both rectangles; the two bottom edges of the green light-emitting part G extend along the column direction Y, the right-angled waist of the green light-emitting part G is at the second gap b, and the other waist of the green light-emitting part G is at the first gap a; and the long sides of the red light-emitting part R and the blue light-emitting part B extend along the column direction Y, and the short sides of the red light-emitting part R and the blue light-emitting part B extend along the row direction X. The shape of the support layer 105 may be a rectangle, and a long side of the support layer 105 extends along a direction parallel to the waist of the green light-emitting part G at the first gap a, and a short side of the support layer 105 extends along a direction vertical to the waist of the green light-emitting part G at the first gap a.

Compared with the rectangular design in FIG. 2, the gap between the green light-emitting parts G can be fully utilized to provide the support layer 105 while avoiding sacrificing the pixel aperture ratio of the green light-emitting parts, by deforming the shapes of the green light-emitting parts G in FIG. 3. Of course, during specific implementation, the red light-emitting part R and/or the blue light-emitting part B can also be designed in a special shape, and the shape of the support layer 105 can be flexibly set, which are not limited here.

Figure 4:
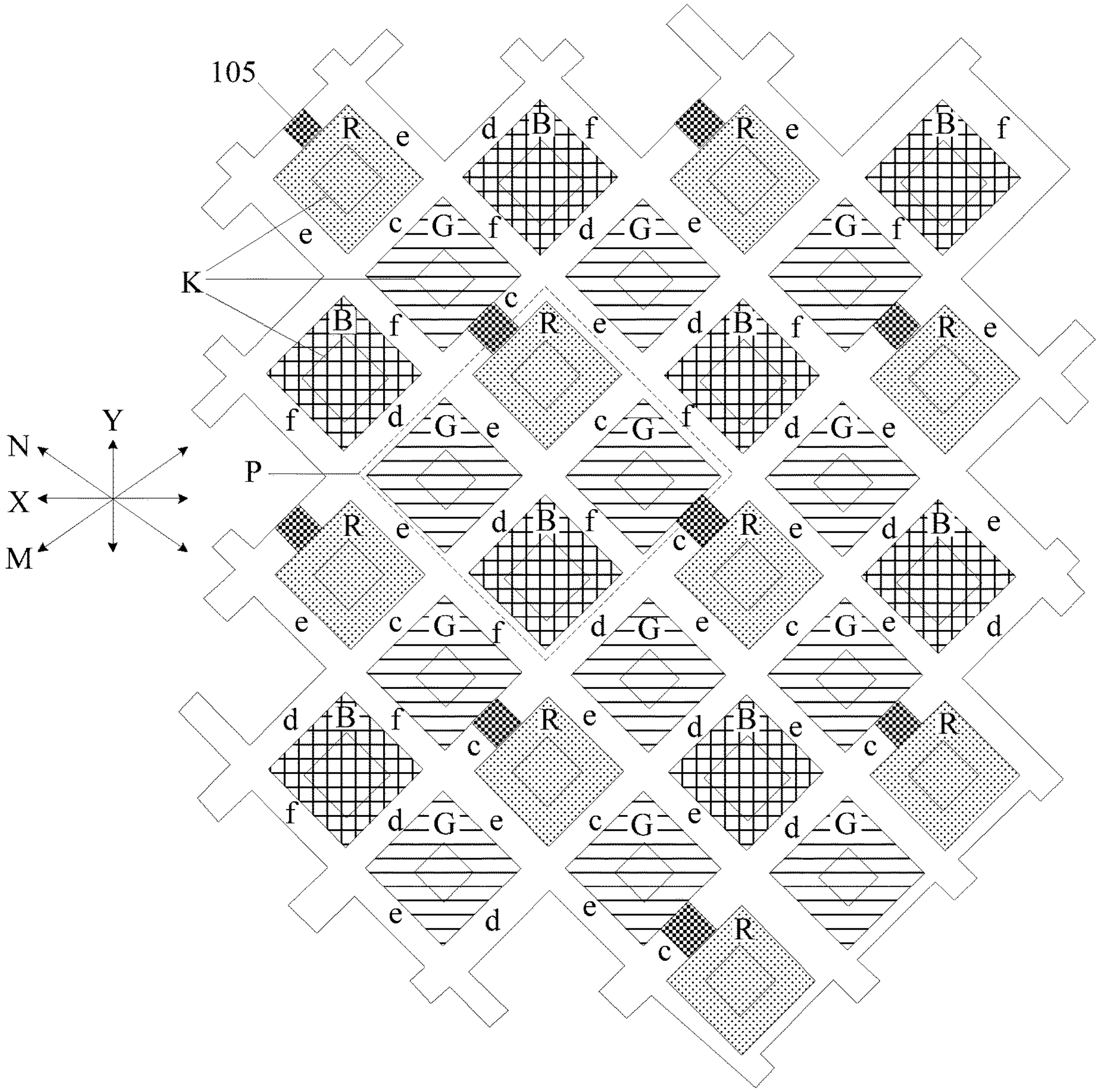
FIG. 4 is another schematic diagram of a pixel arrangement provided by an embodiment of the present disclosure.

Optionally, in the above-mentioned display substrate provided by embodiments of the present disclosure, as shown in FIG. 4, the plurality of light-emitting parts may include a plurality of red light-emitting parts R, a plurality of green light-emitting parts G, and a plurality of blue light-emitting parts B;

- the plurality of red light-emitting parts R and the plurality of blue light-emitting parts B are arranged in an array, and the plurality of green light-emitting parts G are arranged in an array;
- one red light-emitting part R, two green light-emitting parts G and one blue light-emitting part B form a pixel unit P; the pixel units P are arranged cyclically in both the first direction N and the second direction M; the first direction N intersects with the row direction X and the column directions Y; and the second direction M intersects with the first direction N, the row direction X, and the column direction Y;
- in the pixel unit P, the red light-emitting part R and the green light-emitting part G are alternately arranged in both the first direction N and the second direction M, and the blue light-emitting part B and the green light-emitting part G are arranged alternately in both the first direction N and the second direction M;
- in the first direction N, a third gap c is provided between the red light-emitting part R and the green light-emitting part G, and a fourth gap d is provided between the blue light-emitting part B and the green light-emitting part G; and the first direction N intersects with the row direction X and the column direction Y;
- in the second direction M, a fifth gap e is provided between the red light-emitting part R and the green light-emitting part G, and a sixth gap f is provided between the blue light-emitting part B and the green light-emitting part G; and the second direction M intersects with the first direction N, the row direction X, and the column direction Y; and
- the support layer 105 may be at the third gap c, and one third gap c is provided between adjacent support layers 105 in the first direction N.

Since the light-emitting efficiencies of the red light-emitting material and the green light-emitting material is greater than that of the blue light-emitting material, the support layer 105 is placed at the gap between the red light-emitting part R and the green light-emitting part G through the light-emitting parts, so as to increase the pixel aperture ratio of the blue light-emitting part B and make the light-emitting efficiencies and light-emitting life of the red light-emitting part R, the green light-emitting part G and the blue light-emitting part B match with each other, which is beneficial to improving the display quality.

Of course, during specific implementation, the arrangement density and position of the support layer 105 can also be flexibly set. For example, the support layer 105 can be disposed in at least one of the third gap c, the fourth gap d, the fifth gap e, or the sixth gap f, which is not limited here.

In some embodiments, as shown in FIG. 4, the shapes of the red light-emitting part R, the green light-emitting part G and the blue light-emitting part B may all be rhombuses; and two sets of opposite sides of the red light-emitting part R, the green light-emitting part G and the blue light-emitting part B extend along the first direction N and the second direction M respectively; and the shape of the support layer 105 may be a rhombus, and the two sets of opposite sides of the support layer 105 extend along the first direction N and the second direction M respectively. It should be noted that during specific implementation, the shapes of the red light-emitting part R, the green light-emitting part G, the blue light-emitting part B and the support layer 105 are not limited to the above-mentioned rhombuses, and can also be other shapes, which are not limited here.

Figure 8:
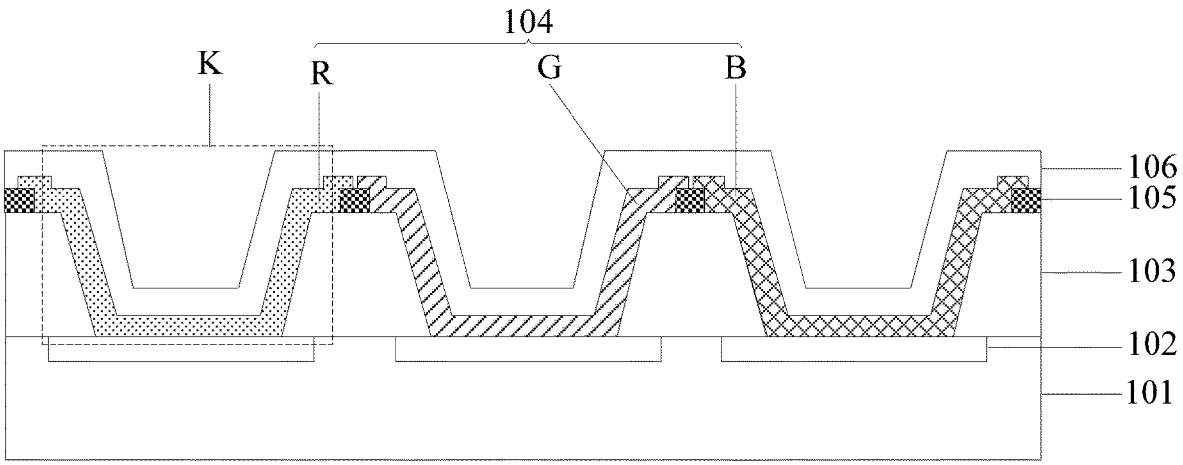
FIG. 8 is another schematic structural diagram of a display substrate provided by an embodiment of the present disclosure.

Optionally, in the above display substrate provided by embodiments of the present disclosure, as shown in FIGS. 2 and 8, in a direction perpendicular to the base substrate 101, a distance between a surface facing away from the base substrate 101, of the light-emitting material layer 104 (i.e., the upper surface of the light-emitting material layer 104) and a surface facing away from the base substrate 101, of the support layer 105 (i.e., the upper surface of the support layer 105) may range from 0.1 μm to 3 μm. This can avoid the problem that the film layer at the support layer 105 is too high to be scratched by the FMM, thereby improving product reliability and improving the evaporation chamber environment.

Figure 5:
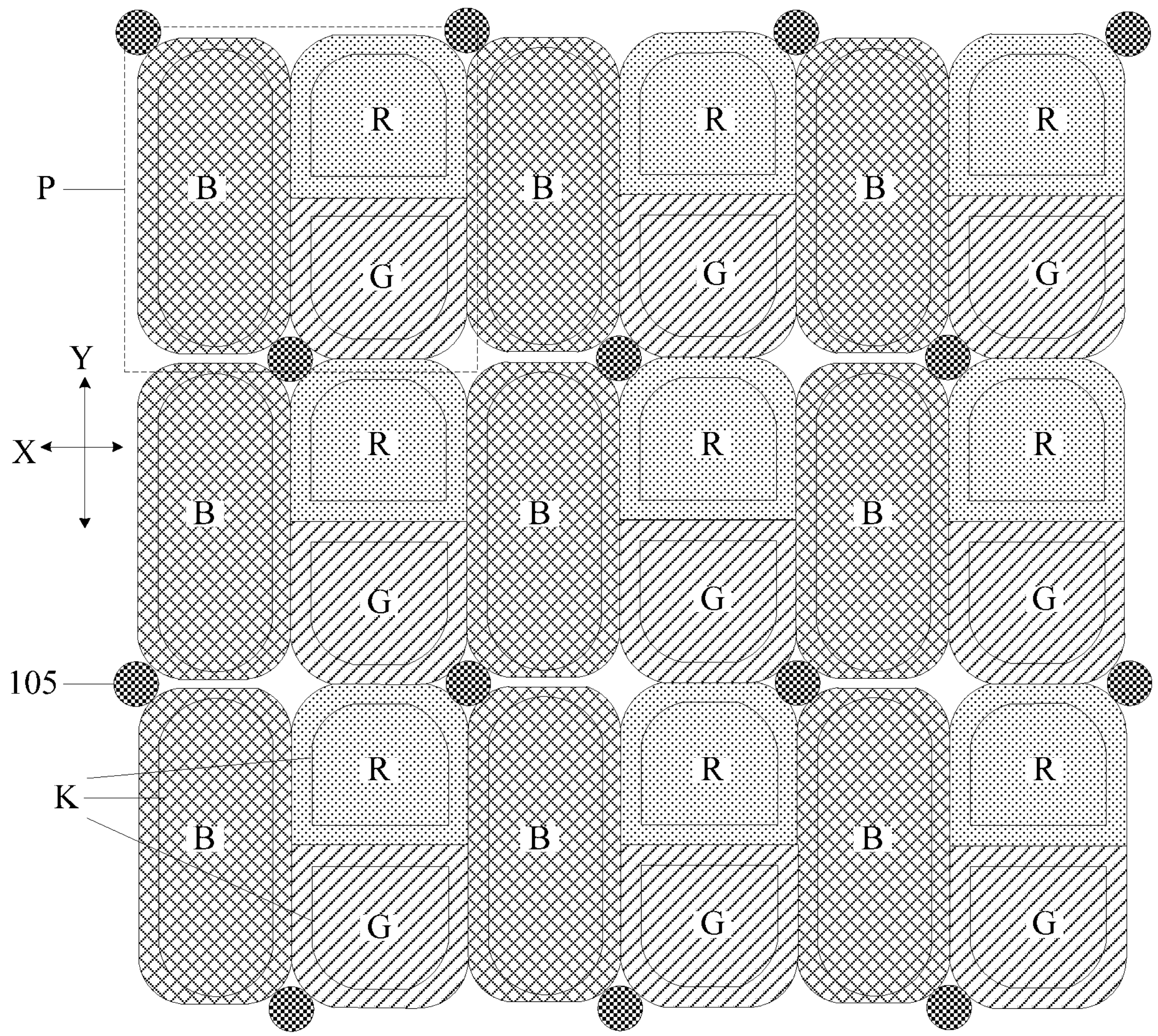
FIG. 5 is another schematic diagram of a pixel arrangement provided by an embodiment of the present disclosure.
Figure 6:
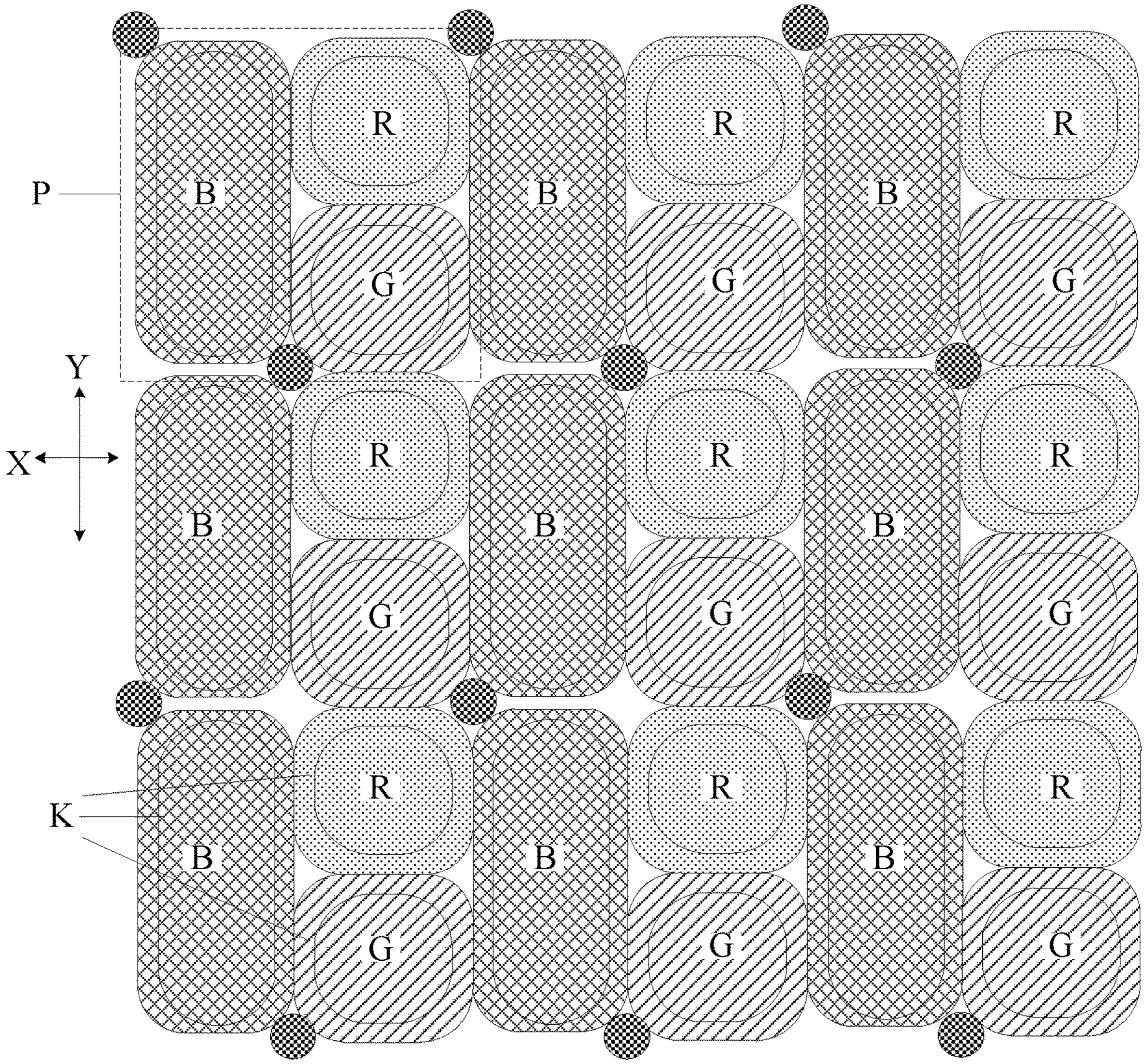
FIG. 6 is another schematic diagram of a pixel arrangement provided by an embodiment of the present disclosure.
Figure 7:
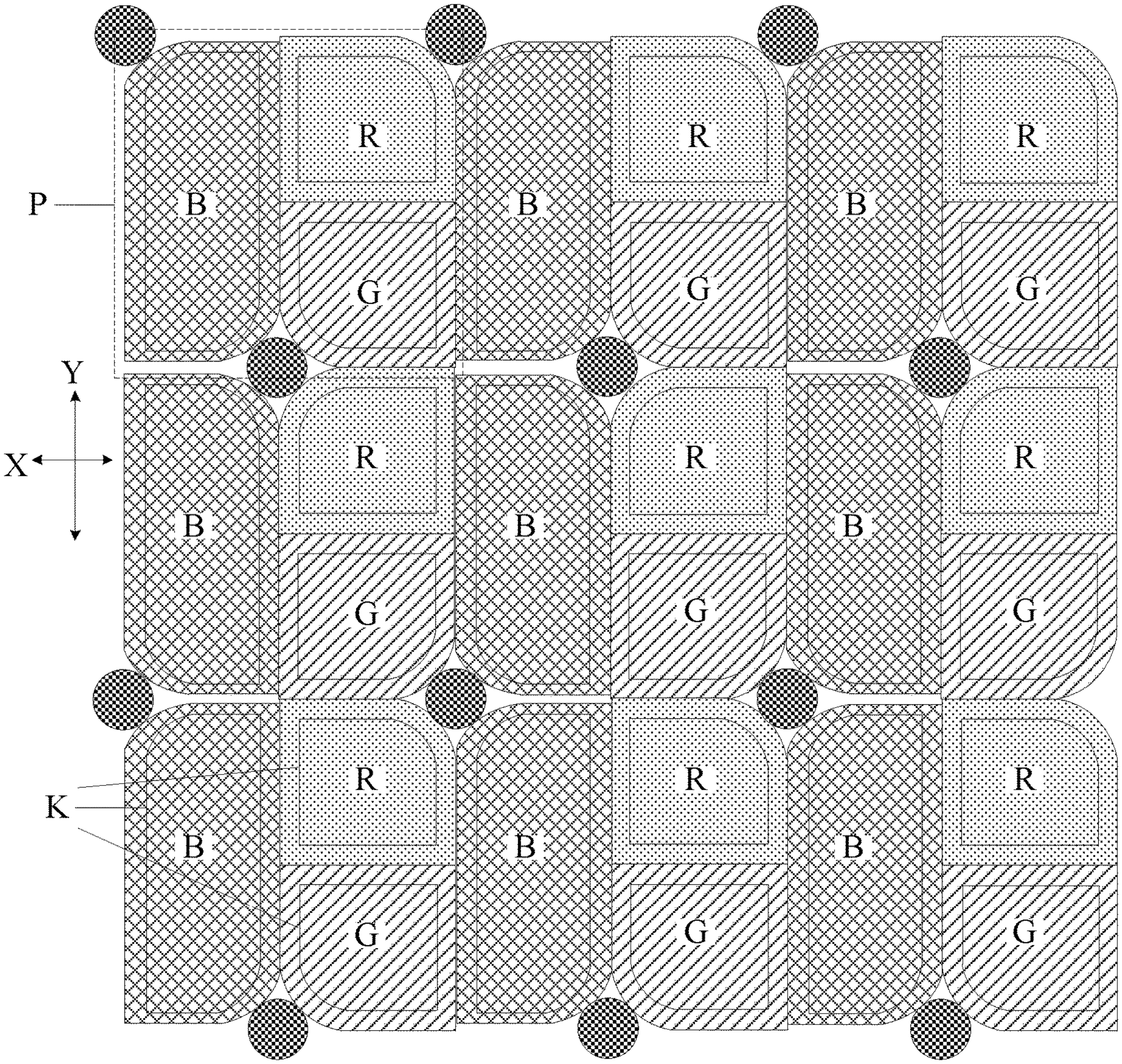
FIG. 7 is another schematic diagram of a pixel arrangement provided by an embodiment of the present disclosure.

Optionally, in the above display substrate provided by embodiments of the present disclosure, as shown in FIGS. 5 to 7, the plurality of light-emitting parts may include a plurality of red light-emitting parts R, a plurality of green light-emitting parts G and a plurality of blue light-emitting parts B;

- one red light-emitting part R, one green light-emitting part G and one blue light-emitting part B form a pixel unit P, and the pixel units P are arranged cyclically in both the row direction X and the column direction Y;
- the red light-emitting part R and the green light-emitting part G in the pixel unit P are alternately arranged in the column direction Y, and the red light-emitting part R and the green light-emitting part G are located on the same side of the blue light-emitting part B; and
- multiple rows of support layers 105 are provided; the i-th row of support layer 105 is located in the gap between adjacent pixel units P, the (i+1)-th row of support layer is located in the gap between the column where the blue light-emitting part B is and the column where the red light-emitting part R is, in the pixel unit; and the i-th row of support layer and the (i+1)-th row of support layer do not overlap with each other in the column direction, and i is an odd number.

The pixel arrangement in FIGS. 5 to 7 enables the red light-emitting part R, the green light-emitting part G, the blue light-emitting part B and the support layer 105 to be evenly arranged, which is conducive to the FMM tensioning.

In some embodiments, as shown in FIG. 5, the shape of the blue light-emitting part B is a rounded rectangle (that is, a rectangle with arcs at its four corners); the opposite sides of the red light-emitting part R and the green light-emitting part G are straight lines and parallel to each other; and a side of the red light-emitting part R away from the green light-emitting part G is arc-shaped, a side of the green light-emitting part G away from the red light-emitting part R is arc-shaped, and the side of the green light-emitting part G facing the red light-emitting part R is square. In this case, the gap among the pixel units P is surrounded by arcs; and the red light-emitting part R, the green light-emitting part G and the blue light-emitting part B all have regular shapes, which is conducive to FMM tensioning.

In some embodiments, as shown in FIG. 6, the shapes of the red light-emitting part R, the green light-emitting part G and the blue light-emitting part B may be rounded rectangles; and the support layer 105 is at a position where the red light-emitting part R, the green light-emitting part G and the blue light-emitting part B are all circular arcs. In this arrangement, the red light-emitting part R, the green light-emitting part G and the blue light-emitting part B are more evenly distributed, and the force is naturally more uniform, which is very beneficial for FMM tensioning.

In some embodiments, as shown in FIG. 7, the shapes of the red light-emitting part R, the green light-emitting part G and the blue light-emitting part B may all be quadrilaterals; where the two sets of diagonal corners of the blue light-emitting part B are respectively right angles and arc chamfers; one of the four corners of the red light-emitting part R is an arc chamfer and three of the four corners of the red light-emitting part R are right angles; one of the four corners of the green light emitting part G is an arc chamfer and three of the four corners of the green light emitting part G are right angles; and the gap between adjacent pixel units P is surrounded by arc chamfers or right angles. The pixel arrangement shown in FIG. 7 can simultaneously increase the pixel aperture ratios of the red light-emitting part R, the green light-emitting part G and the blue light-emitting part B; and the arrangement of the red light-emitting part R, the green light-emitting part G and the blue light-emitting part B is very even, which is conducive to FMM tensioning.

In addition, it can be seen from FIG. 7 that the gap surrounded by arc chamfers is larger than the gap surrounded by right angles. Therefore, the support layer 105 can be disposed in the gap formed by the arc chamfers of the red light-emitting part R, the green light-emitting part G and the blue light-emitting part B in the adjacent pixel units P, which facilitates the production of the support layer 105.

Optionally, in the above-mentioned display substrate provided by embodiments of the present disclosure, as shown in FIGS. 2 to 7, the shape of the orthographic projection of the pixel opening K covered by the light-emitting part (such as the red light-emitting part R, the green light-emitting part G, and the blue light-emitting part B) on the base substrate 101 may be the same as the shape of the orthographic projection of the light-emitting part (for example, the red light-emitting part R, the green light-emitting part G, and the blue light-emitting part B) on the base substrate 101, so as to ensure that the thicknesses inside the pixel opening K and on the pixel definition layer 103, of the light-emitting part are of better uniformity. Of course, the shapes of the two can also be different, which is not limited here.

Optionally, in the above display substrate provided by embodiments of the present disclosure, in order to improve poor color mixing while taking into account a larger pixel aperture ratio, as shown in FIGS. 8 to 12, the lateral surface of the support layer 105 can be in contact with the lateral surface of the light-emitting part (for example, the red light-emitting part R, the green light-emitting part G, and the blue light-emitting part B); and the surface edge on a side away from the base substrate 101, of the support layer 105 is in contact with the surface edge on a side facing the base substrate 101, of the light-emitting part (such as the red light-emitting part R, the green light-emitting part G, and the blue light-emitting part B), that is, the support layer 105 can be in contact with the edges of the light-emitting parts and overlap with the light-emitting parts.

Figure 9:
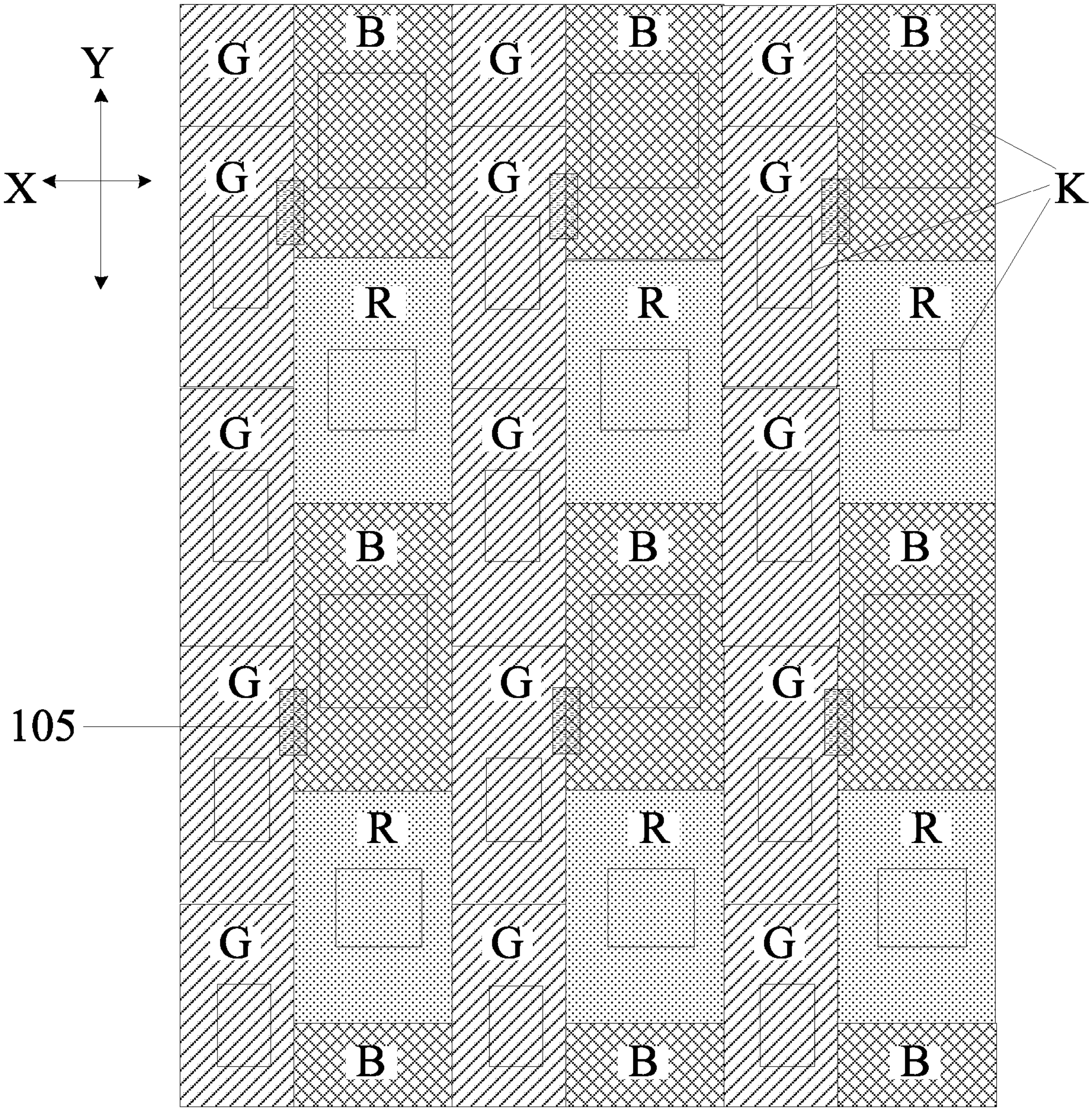
FIG. 9 is another schematic diagram of a pixel arrangement provided by an embodiment of the present disclosure.

Optionally, in the above display substrate provided by embodiments of the present disclosure, as shown in FIG. 9, the plurality of light-emitting parts may include a plurality of red light-emitting parts R, a plurality of green light-emitting parts G, and a plurality of blue light-emitting parts B;

one red light-emitting part R, two green light-emitting parts G and one blue light-emitting part B form a pixel unit P, and the pixel units P are arranged cyclically in both the row direction X and the column direction Y;

in the pixel unit P, the red light-emitting part R and the blue light-emitting part B are alternately arranged in the column direction Y, two green light-emitting parts G are alternately arranged in the column direction Y, and the two green light-emitting parts G are at the same side of the red light-emitting part R and the blue light-emitting part B; and the orthographic projection of the support layer 105 on the base substrate 101 overlaps with the orthographic projection of the edge adjacent to the green light-emitting part G, of the blue light-emitting part B on the base substrate 101, and the orthographic projection of the edge adjacent to the blue light-emitting part B, of the green light-emitting part G on the base substrate 101. In other words, the support layer 105 is disposed at adjacent edges of the blue light-emitting part B and the green light-emitting part G.

The arrangement shown in FIG. 9 can result in the larger aperture ratios of the red light-emitting part R, the green light-emitting part G and the blue light-emitting part B.

Figure 10:
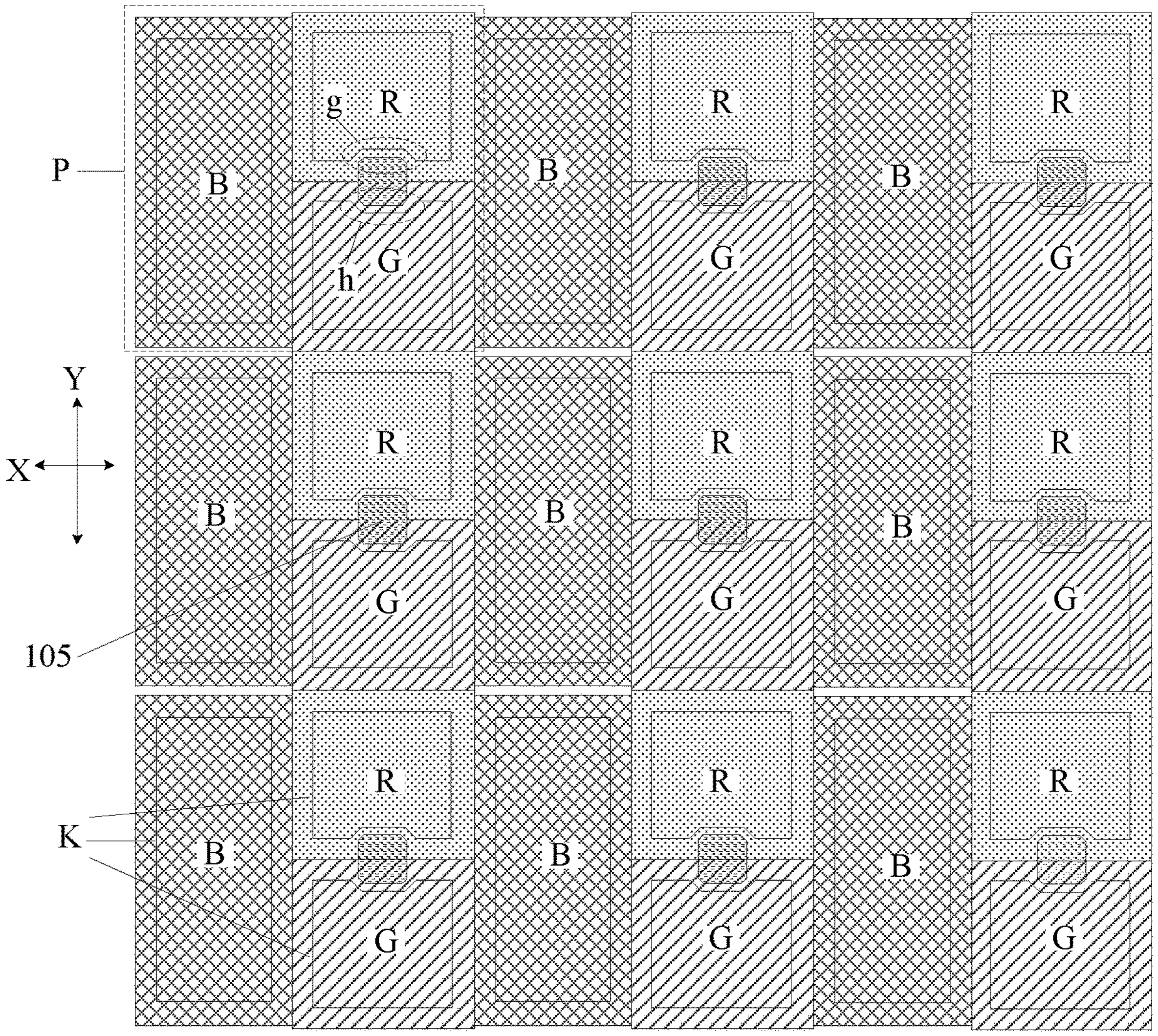
FIG. 10 is another schematic diagram of a pixel arrangement provided by an embodiment of the present disclosure.
Figure 11:
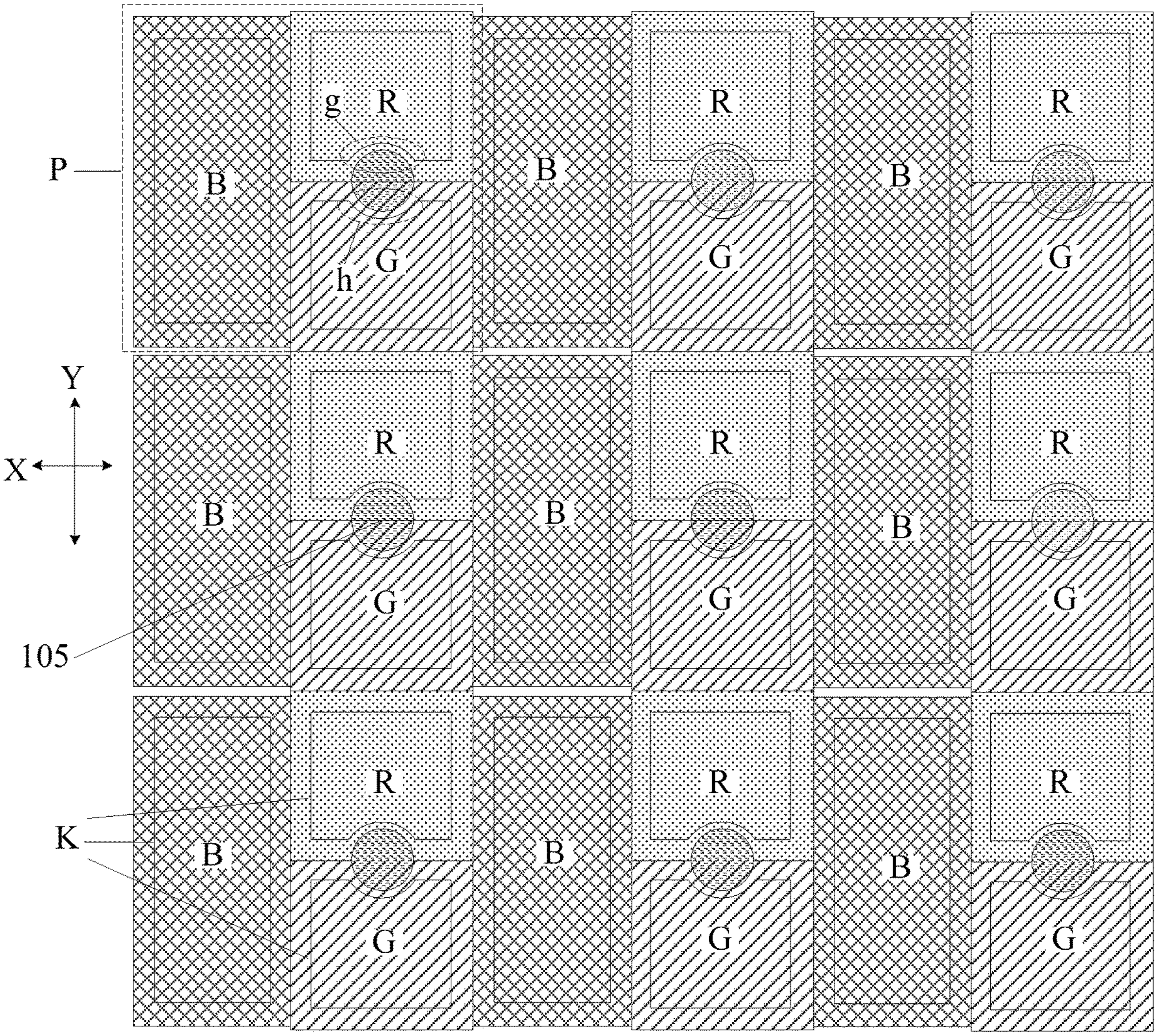
FIG. 11 is another schematic diagram of a pixel arrangement provided by an embodiment of the present disclosure.

Optionally, in the above display substrate provided by embodiments of the present disclosure, as shown in FIGS. 10 and 11, the plurality of light emitting parts may include a plurality of red light emitting parts R, a plurality of green light emitting parts G and a plurality of blue light emitting parts B;

one red light-emitting part R, one green light-emitting part G and one blue light-emitting part B form a pixel unit P, and the pixel units P are arranged cyclically in both the row direction X and the column direction Y;

in the pixel unit, the red light-emitting part R and the green light-emitting part G are alternately arranged in the column direction Y, and the red light-emitting part R and the green light-emitting part G are at the same side of the blue light-emitting part B; and the orthographic projection of the support layer 105 on the base substrate 101 overlaps with the orthographic projection of the edge adjacent to the green light-emitting part G, of the red light-emitting part R on the base substrate 101, and the orthographic projection of the edge adjacent to the red light-emitting part R, of the green light-emitting part G in the pixel unit P on the base substrate 101. In other words, the support layer 105 is disposed at the adjacent edges of the red light-emitting part R and the green light-emitting part G. This arrangement can increase the light-emitting area of the blue light-emitting part B, thereby improving the blue light life.

In some embodiments, as shown in FIGS. 10 and 11, in the pixel unit P, the pixel opening K covered by the red light-emitting part R includes a first side, the pixel opening K covered by the green light-emitting part G includes a second side, and the first side and the second side are both adjacent to the support layer 105;

the first side includes a first avoidance part g, and the second side includes a second avoidance part h, both the first avoidance part g and the second avoidance part h are recessed in a direction away from the second side; and the shape of the first avoidance part g is the same as the shape of the side adjacent to the first avoidance part g, of the support layer 105; and the shape of the second avoidance part h is the same as the shape of the side adjacent to the second avoidance part h, of the support layer 105.

Specifically, in FIG. 10, the support layer 105 is a chamfered square, and the shapes of the first avoidance part g and the second avoidance part h are approximately arc-shaped fold lines; and in FIG. 11, the support layer 105 is circular, and the shapes of the first avoidance part g and the second avoidance part h are arcs.

Figure 12:
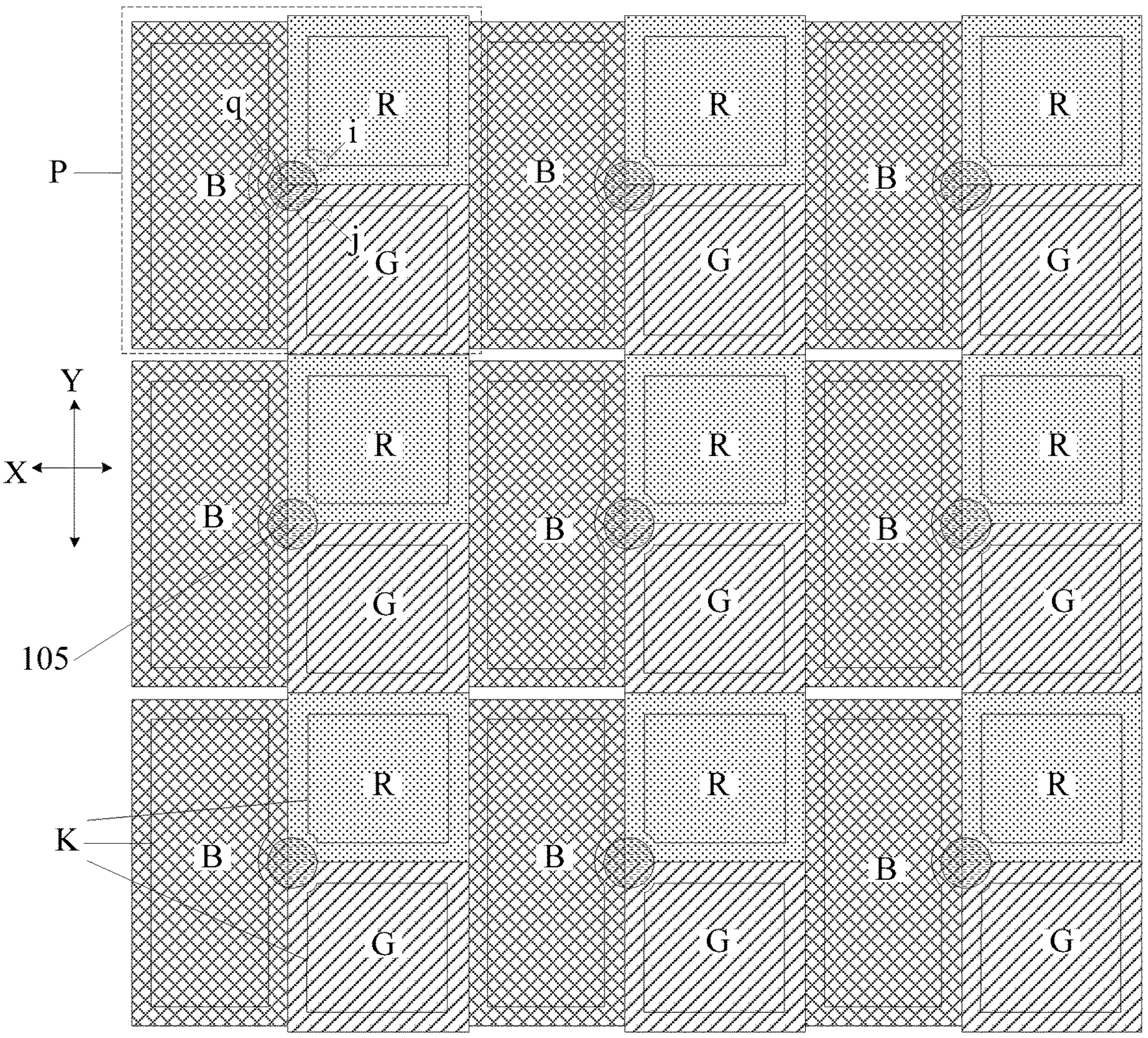
FIG. 12 is another schematic diagram of pixel arrangement provided by an embodiment of the present disclosure.

Optionally, in the above-mentioned display substrate provided by embodiments of the present disclosure, as shown in FIG. 12, the plurality of light-emitting parts may include a plurality of red light-emitting parts R, a plurality of green light-emitting parts G, and a plurality of blue light-emitting parts B;

one red light-emitting part R, one green light-emitting part G and one blue light-emitting part B form a pixel unit P, and the pixel units P are arranged cyclically in both the row direction X and the column direction Y;

in the pixel unit, the red light-emitting part R and the green light-emitting part G are alternately arranged in the column direction Y, and the red light-emitting part R and the green light-emitting part G are at the same side of the blue light-emitting part B; and the orthographic projection of the support layer 105 on the base substrate 101 overlaps with the orthographic projections of adjacent edges of the red light-emitting part R, the green light-emitting part G, and the blue light-emitting part B in the pixel unit P on the base substrate 101. In other words, the support layer 105 is disposed at the adjacent edges of the red light-emitting part R, the green light-emitting part G and the blue light-emitting part B. This arrangement can simultaneously increase the light-emitting areas of the red light-emitting part R, the green light-emitting part G and the blue light-emitting part B, thereby improving the device life.

In some embodiments, as shown in FIG. 12, in the pixel unit P, the pixel opening K covered by the red light-emitting part R includes a first corner area, the pixel opening K covered by the green light-emitting part G includes a second corner area, and the pixel opening K covered by the blue light-emitting part B includes a third side; and the first corner area, the second corner area and the third side are all adjacent to the support layer 105;

the first corner area includes a third avoidance part i, the second corner area includes a fourth avoidance part j, and the third side includes a fifth avoidance part q; and the third avoidance part i, the fourth avoidance part j and the fifth avoidance part q are all recessed in a direction away from the support layer; and the third avoidance part i has the same shape as the support layer 105 adjacent to the third avoidance part i, the fourth avoidance part j has the same shape as the support layer 105 adjacent to the fourth avoidance part j, and the fifth avoidance part q has the same shape as the support layer 105 adjacent to the fifth avoidance part q.

Specifically, in FIG. 12, the support layer 105 is circular; and the shapes of the third avoidance part i, the fourth avoidance part j, and the fifth avoidance part q are all arcs.

Optionally, in the above display substrate provided by embodiments of the present disclosure, as shown in FIGS. 1 and 8, the display substrate may also include: a second electrode 106, and the second electrode 106 may be disposed on a side away from the pixel definition layer 103, of the light-emitting material layer 104 on a whole surface. In some embodiments, the first electrode 102 may be an anode that provides holes, and the second electrode 106 may be a cathode 106 that provides electrons.

It should be noted that in the present disclosure, the distance relationship between the pixel openings K covered by adjacent light-emitting parts is not limited. For example, in FIGS. 5-7 and 10-12, the distance between the pixel openings K covered by the adjacent blue light-emitting parts B can be greater than, less than, or equal to a distance between the pixel openings K covered by the red light-emitting part R and green light-emitting part B which are adjacent.

In addition, the above only illustrates the arrangement of the red light-emitting parts R, the green light-emitting parts G and the blue light-emitting parts B, and the arrangement of the support layer 105. The shapes and sizes of the red light-emitting part R, the green light-emitting part G, the blue light-emitting part B and the supporting layer 105, as well as the density and position of the supporting layer 105 are not limited to the above contents.

Based on the same inventive concept, an embodiment of the present disclosure further provides a display device, including the above-mentioned display substrate provided by the embodiments of the present disclosure. Since the principle of the display device to solve the problem is similar to the principle of the above-mentioned display substrate to solve the problem, the implementation of the display device can be referred to the above embodiments of the display substrate, and repeated details will not be described again.

In some embodiments, the display device is applicable to the organic electroluminescence display technology and the quantum dot luminescence display technology, and can be used for mobile phones, tablet computers, televisions, monitors, laptop computers, digital photo frames, navigators, smart watches, fitness wristbands, personal digital assistants, and any other product or component with a display function. The display device includes but is not limited to: a radio frequency unit, a network module, an audio output unit, an input unit, a sensor, a display unit, a user input unit, an interface unit, a memory, a processor, a power supply and other components. Those skilled in the art can understand that the structure of the display device described above does not constitute a limitation on the display device. The display device may include more or less of the above components, or combine certain components, or arrange different components.

Based on the same inventive concept, the embodiments of the present disclosure further provide a fine metal mask for producing the above-mentioned light-emitting material layer. The fine metal mask includes: a plurality of opening areas, and the plurality of opening areas correspond to a plurality of light-emitting parts in shape and position. Since the principle of the fine metal mask to solve the problem is similar to the principle of the above-mentioned display substrate to solve the problem, the implementation of the fine metal mask can be referred to the embodiments of the above-mentioned display substrate, and repeated details will not be repeated.

Obviously, those skilled in the art can make various changes and modifications to the disclosed embodiments without departing from the spirit and scope of the disclosed embodiments. In this way, if these modifications and variations of the embodiments of the present disclosure fall within the scope of the claims of the present disclosure and equivalent technologies, the present disclosure is also intended to include these modifications and variations.

What is claimed is:

1. A display substrate, comprising:

a base substrate;

a plurality of mutually independent first electrodes on the base substrate;

a pixel definition layer on a side away from the base substrate, of a layer where the plurality of first electrodes are; wherein the pixel definition layer comprises a plurality of pixel openings, an overlapping portion and a non-overlapping portion are provided between the pixel opening and the first electrode, the non-overlapping portion surrounds the overlapping portion, and the pixel definition layer covers the non-overlapping portion and a gap between the first electrodes;

a light-emitting material layer on a side away from the base substrate, of the pixel definition layer; wherein the light-emitting material layer comprises a plurality of light-emitting parts, and the light-emitting parts extend from the pixel openings to the pixel definition layer; and a support layer on the pixel definition layer; wherein the support layer is in direct contact with the light-emitting parts, and an orthographic projection of the support layer on the base substrate overlaps orthographic projections of gaps among the plurality of first electrodes on the base substrate;

wherein a lateral surface of the support layer is in contact with a lateral surface of the light-emitting part;

a surface edge on a side away from the base substrate, of the support layer is in contact with a surface edge on a side facing the base substrate, of the light-emitting part; and a gap is provided between adjacent light-emitting parts on a surface on the side, away from the base substrate, of the support layer.

2. The display substrate according to claim 1, wherein the plurality of light-emitting parts comprise a plurality of red light-emitting parts, a plurality of green light-emitting parts and a plurality of blue light-emitting parts;

one red light-emitting part, two green light-emitting parts and one blue light-emitting part form a pixel unit, and pixel units are arranged cyclically in both a row direction and a column direction;

in the pixel unit, the red light-emitting part and the blue light-emitting are alternately arranged in the column direction, the two green light-emitting parts are alternately arranged in the column direction, and the two green light-emitting parts are at a same side of the red light-emitting part and the blue light-emitting part; and an orthographic projection of the support layer on the base substrate overlaps with an orthographic projection of an edge adjacent to the green light-emitting part, of the blue light-emitting part on the base substrate, and an orthographic projection of an edge adjacent to the blue light-emitting part, of the green light-emitting part on the base substrate.

3. The display substrate according to claim 1, wherein the plurality of light-emitting parts comprise a plurality of red light-emitting parts, a plurality of green light-emitting parts and a plurality of blue light-emitting parts;

one red light-emitting part, one green light-emitting part and one blue light-emitting part form a pixel unit, and pixel units are arranged cyclically in both a row direction and a column direction;

the red light-emitting part and the green light-emitting part in the pixel unit are alternately arranged in the column direction, and the red light-emitting part and the green light-emitting part are at a same side of the blue light-emitting part; and an orthographic projection of the support layer on the base substrate overlaps with an orthographic projection of an edge adjacent to the green light-emitting part, of the red light-emitting part on the base substrate, and an orthographic projection of an edge adjacent to the red light-emitting part, of the green light-emitting part in the pixel unit on the base substrate;

wherein in the pixel unit, the pixel opening covered by the red light-emitting part comprises a first side, the pixel opening covered by the green light-emitting part comprises a second side, and the first side and the second side are both adjacent to the support layer;

the first side comprises a first avoidance part, the second side comprises a second avoidance part, and both the first avoidance part and the second avoidance part are recessed in a direction away from the support layer;

a shape of the first avoidance part is same as a shape of a side adjacent to the first avoidance part, of the support layer; and a shape of the second avoidance part is same as a shape of a side adjacent to the second avoidance part, of the support layer.

4. The display substrate according to claim 1, wherein the plurality of light-emitting parts comprise a plurality of red light-emitting parts, a plurality of green light-emitting parts and a plurality of blue light-emitting parts;

one red light-emitting part, one green light-emitting part and one blue light-emitting part form a pixel unit, and pixel units are arranged cyclically in both a row direction and a column direction;

in the pixel unit, the red light-emitting part and the green light-emitting part are alternately arranged in the column direction, and the red light-emitting part and the green light-emitting part are at a same side of the blue light-emitting part; and an orthographic projection of the support layer on the base substrate overlaps with orthographic projections of adjacent edges of the red light-emitting part, the green light-emitting part, and the blue light-emitting part in the pixel unit on the base substrate;

wherein in the pixel unit, the pixel opening covered by the red light-emitting part comprises a first corner area, the pixel opening covered by the green light-emitting part comprises a second corner area, and the pixel opening covered by the blue light-emitting part comprises a third side;

the first corner area, the second corner area and the third side are all adjacent to the support layer;

the first corner area comprises a third avoidance part, the second corner area comprises a fourth avoidance part, the third side comprises a fifth avoidance part;

the third avoidance part, the fourth avoidance part and the fifth avoidance part are all recessed in a direction away from the support layer;

the third avoidance part has a same shape as the support layer adjacent to the third avoidance part;

the fourth avoidance part has a same shape as the support layer adjacent to the fourth avoidance part; and the fifth avoidance part has a same shape as the support layer adjacent to the fifth avoidance part.

5. The display substrate according to claim 1, further comprising: a second electrode; wherein the second electrode is disposed on a side away from the pixel definition layer, of the light-emitting material layer on a whole surface.

6. A display device, comprising the display substrate according to claim 1.

7. A fine metal mask, for producing the light-emitting material layer according to claim 1;

wherein the fine metal mask comprises: a plurality of opening areas, and the plurality of opening areas correspond to the plurality of light-emitting parts in shape and location.

* * * * *